United States Patent
Rana et al.

(10) Patent No.: US 8,372,753 B2
(45) Date of Patent: *Feb. 12, 2013

(54) DRY CLEANING OF SILICON SURFACE FOR SOLAR CELL APPLICATIONS

(75) Inventors: Virendra V S Rana, Los Gatos, CA (US); Michael P. Stewart, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 92 days.

This patent is subject to a terminal disclaimer.

(21) Appl. No.: 12/825,103

(22) Filed: Jun. 28, 2010

(65) Prior Publication Data

US 2010/0261302 A1    Oct. 14, 2010

Related U.S. Application Data (63) Continuation of application No. 12/403,931, filed on Mar. 13, 2009, now Pat. No. 7,749,917.

(60) Provisional application No. 61/141,980, filed on Dec. 31, 2008.

(51) Int. Cl.
    *H01L 21/31* (2006.01)
(52) U.S. Cl. ............... 438/706; 438/765; 257/E21.214
(58) Field of Classification Search ............... 438/706, 438/762, 769, 761
    See application file for complete search history.

(56) References Cited

U.S. PATENT DOCUMENTS

| | | | |
|---|---|---|---|
| 6,362,097 B1 | 3/2002 | Demaray et al. | |
| 6,838,347 B1 | 1/2005 | Liu et al. | |
| 7,416,989 B1 | 8/2008 | Liu et al. | |
| 7,749,917 B1 | 7/2010 | Rana et al. | |
| 2002/0045355 A1* | 4/2002 | Chong et al. | 438/721 |
| 2003/0166342 A1* | 9/2003 | Chinn et al. | 438/706 |
| 2004/0106284 A1 | 6/2004 | Grasshoff et al. | |
| 2004/0251235 A1* | 12/2004 | Shinriki et al. | 216/58 |
| 2005/0208740 A1* | 9/2005 | Todd | 438/482 |
| 2005/0257890 A1 | 11/2005 | Park et al. | |
| 2007/0202254 A1 | 8/2007 | Ganguli et al. | |
| 2007/0238321 A1 | 10/2007 | Futase et al. | |
| 2008/0160210 A1 | 7/2008 | Yang et al. | |

OTHER PUBLICATIONS

International Search Report and Written Opinion of the International Searching Authority mailed Aug. 20, 2010 in PCT/US2009/069251.

* cited by examiner

*Primary Examiner* — Charles Garber
*Assistant Examiner* — Reema Patel
(74) *Attorney, Agent, or Firm* — Patterson & Sheridan, LLP (57) ABSTRACT

A method and apparatus for cleaning layers of solar cell substrates is disclosed. The substrate is exposed to a reactive gas that may comprise neutral radicals comprising nitrogen and fluorine, or that may comprise anhydrous HF and water, alcohol, or a mixture of water and alcohol. The reactive gas may further comprise a carrier gas. The reactive gas etches the solar cell substrate surface, removing oxygen and other impurities. When exposed to the neutral radicals, the substrate grows a thin film containing ammonium hexafluorosilicate, which is subsequently removed by heat treatment.

18 Claims, 3 Drawing Sheets

DRY CLEANING OF SILICON SURFACE FOR SOLAR CELL APPLICATIONS

CROSS-REFERENCE TO RELATED APPLICATIONS

This application is a continuation of U.S. patent application Ser. No. 12/403,931, which claims benefit of U.S. Provisional Patent Application Ser. No. 61/141,980, filed Dec. 31, 2008.

FIELD

Embodiments of the invention relate to methods and apparatus for manufacturing solar cells. More specifically, embodiments of the invention provide methods and apparatus for cleaning layers of solar cell substrates.

BACKGROUND

Photovoltaics (PV) or solar cells are devices which convert sunlight into direct current (DC) electrical power. A typical PV cell includes a p-type silicon wafer, substrate, or sheet typically less than about 0.3 mm thick with a thin layer of an n-type silicon material disposed on top of the p-type substrate. The generated voltage, or photo-voltage, and generated current by the photovoltaic device are dependent on the material properties of the p-n junction, the interfacial properties between deposited layers, and the surface area of the device. When exposed to sunlight (consisting of energy from photons), the p-n junction of the PV cell generates pairs of free electrons and holes. The electric field formed across the depletion region of the p-n junction separates the free electrons and holes, creating a voltage. A circuit from n-side to p-side allows the flow of electrons when the PV cell is connected to an electrical load. Electrical power is the product of the voltage multiplied by the current generated as the electrons and holes move through an external load and eventually recombine. Solar cells generate a specific amount of power and cells are tiled into modules sized to deliver the desired amount of system power. Solar modules are created by connecting a number of solar cells and are then joined into panels with specific frames and connectors.

The photovoltaic (PV) market has experienced annual growth rates exceeding 30% for the last ten years. Some articles have suggested that solar cell power production world wide may exceed 10 GWp in the near future. It has been estimated that more than 90% of all photovoltaic modules are silicon wafer based. The high market growth rate in combination with the need to substantially reduce solar electricity costs has resulted in a number of serious challenges for silicon wafer production development for photovoltaics.

In general, silicon substrate based solar energy technology follows two main strategies to reduce the costs of solar electricity by use of PV solar cells. One approach is increasing the conversion efficiency of single junction devices (i.e., power output per unit area) and the other is lowering costs associated with manufacturing the solar cells. Since the effective cost reduction due to conversion efficiency is limited by fundamental thermodynamic and physical attributes, further gains depend on basic technological advances, such as aspects of the invention disclosed herein, to deliver efficient manufacturing processes.

In a typical solar cell manufacturing process, substrates are cleaned from time to time to remove oxidation and other impurities. Processes for cleaning solar substrates, like all solar manufacturing processes, are preferrably efficient, and there is a need for efficient cleaning processes that will integrate well with an efficient overall production system.

SUMMARY

Embodiments of the invention provide a method of processing a layer of a solar cell substrate, comprising disposing the solar cell substrate on a substrate support in a process chamber having walls, providing a reactive gas mixture comprising neutral radicals to the process chamber, directing the reactive gas mixture toward the substrate, reacting the neutral radicals with oxygen from the substrate to form a thin film on the substrate, maintaining a temperature of the substrate below a temperature of the chamber walls during formation of the thin film, and removing the thin film.

Other embodiments of the invention provide a method of processing a solar cell substrate, comprising disposing the substrate on a substrate support in a process chamber, providing a precursor gas mixture to an activation chamber, activating the precursor gas mixture by applying dissociative energy to the precursor gas mixture to form a reactive gas mixture, flowing the reactive gas mixture to the process chamber over an interval sufficient to neutralize at least 90% of charged active species in the reactive gas, exposing the substrate to the reactive gas to release oxygen gas while forming a thin film on the substrate, cooling the substrate while exposing the substrate to the reactive gas, removing the thin film to form an exposed semiconductor surface, and depositing hydrogen, fluorine, or both on the exposed semiconductor surface by heating the thin film.

Other embodiments of the invention provide a method of processing a solar cell substrate, comprising forming a first layer on the substrate, disposing the solar cell substrate in a dry clean chamber, directing neutral radicals comprising nitrogen and fluorine toward the substrate disposed in the dry clean chamber to form a thin film on the first layer, without breaking vacuum, moving the substrate from the dry clean chamber to an anneal chamber, removing the thin film in the anneal chamber by applying heat to the thin film, and forming a second layer on the substrate.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally provide methods and apparatus for cleaning portions of a solar cell device during different phases of the solar cell manufacturing process. During solar cell manufacturing processes, substrates may be exposed to air or oxygen from time to time. Upon exposure, a thin layer of oxide may form on the substrate surface. Embodiments of the invention may be used to remove layers of oxide, along with other impurities, from a solar cell substrate surface. For example, embodiments of the invention may be beneficial for removing oxides from a silicon substrate prior to forming one or more layers thereon, such as an amorphous silicon layer, a crystalline silicon layer, a high quality passivation layer or an anti-reflection coating layer. Embodiments of the invention may also be useful for removing native oxides from the surface of deposited layers used to form parts of a thin-film or a crystalline solar cell device. Embodiments of the invention may also improve passivation of a solar cell by improving the crystal structure of the solar cell at the interface with the passivation layer.

In one embodiment, a solar cell substrate is positioned in a processing chamber on a support. Nitrogen and fluorine containing radicals are provided to the processing chamber and allowed to react with the surface of the substrate to produce a thin layer on the substrate. Heat is then applied to the layer to remove it from the surface. Removal of the layer removes oxide, and impurities contained therein, from the substrate, and in some embodiments, leaves the surface of the substrate terminated with fluorine atoms, hydrogen atoms, or both.

In another embodiment, a solar cell substrate may be subjected to a dry cleaning process comprising exposure to hydrogen fluoride (HF) vapor. A process gas comprising anhydrous HF and water vapor, possibly including alcohols and carrier gases, is provided to the chamber containing the substrate. The HF vapor etches the oxides from the substrate surface, leaving the surface terminated with hydrogen atoms.

Films Used in Solar Cells

Typically, most solar cell layers generally comprise a semiconductor material, such as silicon. Charge generation in solar cells is generally provided by a bulk semiconductor layer, such as a silicon layer. In p-i-n type solar cell junctions the bulk layer is also sometimes called an intrinsic layer to distinguish it from the various doped layers present in the formed solar cell. The intrinsic layer may have any desired degree of crystallinity, which will influence its light-absorbing characteristics. For example, an amorphous intrinsic layer, such as amorphous silicon, will generally absorb light at different wavelengths from intrinsic layers having different degrees of crystallinity, such as microcrystalline silicon. For this reason, most solar cells will use both types of layers to yield the broadest possible absorption characteristics. In some instances, an intrinsic layer may be used as a buffer layer between two dissimilar layer types to provide a smoother transition in optical or electrical properties between the two layers.

Silicon and other semiconductors can be formed into solids having different morphologies. Some common allotropes of solid silicon include amorphous, paracrystalline, and crystalline. The distinction among these forms of silicon is the distance over which an ordered crystal lattice exists. If a uniform lattice propagates over a long distance, the material is crystalline. If there is only very short-range order, or no order, the material is amorphous. Between these two extremes, the material is paracrystalline.

Among the paracrystalline materials, a given specimen may be nanocrystalline, microcrystalline, or polycrystalline. Nanocrystalline and microcrystalline solids comprise crystal grains suspended in an amorphous matrix. Although the distinction between the two rests on the size of the crystal grains, the term "microcrystalline" is used for most purposes because most paracrystalline materials with crystal grains extending into the micrometer range are actually fine-grained polycrystalline material. Polycrystalline material consists of crystal grains separated only by grain boundaries with no amorphous matrix.

Bulk silicon layers are generally formed by providing a silicon source compound to a processing chamber containing a substrate. The substrate is generally disposed on a support in the processing chamber for exposure to the silicon source compound. A gas mixture comprising the silicon source compound is introduced to the chamber. In many instances, the silicon source compound is silane, but other compounds, such as substituted silanes, oligo- or poly-silanes, and cyclic silanes may be used as well. Some suitable silicon source compounds are silane ($SiH_4$), disilane ($Si_2H_6$), silicon tetrafluoride ($SiF_4$), silicon tetrachloride ($SiCl_4$), and dichlorosilane ($SiH_2Cl_2$). Hydrogen gas may be provided as well to control the degree of crystallinity, which will generally rise and fall with the ratio of hydrogen to silicon in the gas mixture. Inert gases may also be used to control the overall reaction by diluting or concentrating the reactants. The reactants may also be activated by ionization to increase rate of reaction and lower the temperature required for film formation. Bulk silicon or semiconductor is frequently referred to as "intrinsic" to distinguish it from "extrinsic" semiconductor which has been doped and has properties different from those of intrinsic semiconductor.

An intrinsic silicon layer may be formed in some embodiments by providing a gas mixture comprising silane and hydrogen gas to a processing chamber containing a substrate. The gas mixture may be provided at a flow rate between about 0.5 standard cubic centimeters per minute per liter of reaction volume (sccm/L) and about 1000 sccm/L, with the ratio of hydrogen to silane being between about 5:1 and about 500:1, or more. The reaction volume is generally defined by the processing chamber in which the reaction is performed. In many embodiments, the reaction volume is defined by the walls of the chamber, the substrate support, and the gas distributor, which is generally disposed over the substrate support. The ratio of hydrogen gas to silane is theoretically unlimited, but as the ratio increases in a given reaction, the deposition rate decreases because availability of silicon limits the rate of reaction. Deposition performed with a hydrogen-to-silane ratio of about 12:1 or less may result in deposition of an amorphous silicon layer. Deposition performed with a hydrogen-to-silane ratio of about 100:1 or more will generally result in a deposited microcrystalline film having a crystallinity fraction of about 60% or more. Precise transition points will naturally also depend on other reaction conditions like temperature and pressure. In some embodiments, it may be advantageous to vary the ratio during deposition to adjust the crystallinity fraction in different parts of the deposited film. For example, it may be desirable to deposit a bulk silicon layer and a buffer layer in one deposition by changing the reaction conditions during deposition.

Chamber pressure may be maintained between about 0.1 Torr and about 100 Torr. Higher pressures will generally promote deposition rate and crystallinity, but more power will be required to maintain a given degree of ionization of the reactants. Thus, a pressure between about 4 Torr and about 12 Torr is preferred for most embodiments. Applying radio frequency (RF) power between about 15 milliWatts per square centimeter of substrate area ($mW/cm^2$) and about 500 mW/cm$^2$ will generally result in deposition of intrinsic silicon at a rate 100 Angstroms per minute (Å/min) or better.

An intrinsic amorphous silicon layer may be deposited by providing a gas mixture of hydrogen gas to silane gas in a ratio of about 12:1 or less. Silane gas may be provided at a flow rate between about 0.5 sccm/L and about 7 sccm/L. Hydrogen gas may be provided at a flow rate between about 5 sccm/L and 60 sccm/L. An RF power between 15 mW/cm$^2$ and about 250 mW/cm$^2$ may be provided to the showerhead. The pressure of the chamber may be maintained between about 0.1 Torr and 20 Torr, preferably between about 0.5 Torr and about 5 Torr. The deposition rate of the intrinsic type amorphous silicon layer will be about 100 Å/min or more. In an exemplary embodiment, the intrinsic type amorphous silicon layer is deposited at a hydrogen to silane ratio of about 2:1.

A p-i buffer type intrinsic amorphous silicon (PIB) layer may be deposited by providing a gas mixture of hydrogen gas to silane gas in a ratio of about 50:1 or less, for example, less than about 30:1, for example between about 20:1 and about 30:1, such as about 25:1. Silane gas may be provided at a flow rate between about 0.5 sccm/L and about 5 sccm/L, such as about 2.3 sccm/L. Hydrogen gas may be provided at a flow rate between about 5 sccm/L and about 80 sccm/L, such as between about 20 sccm/L and about 65 sccm/L, for example about 57 sccm/L. An RF power between about 15 mW/cm$^2$ and about 250 mW/cm$^2$, such as about 30 mW/cm$^2$ may be provided to the showerhead. The pressure of the chamber may be maintained between about 0.1 Torr and about 20 Torr, preferably between about 0.5 Torr and about 5 Torr, such as about 3 Torr. The deposition rate of the PIB layer will be about 100 Å/min or more.

An intrinsic type microcrystalline silicon layer may be deposited by providing a gas mixture of silane gas and hydrogen gas in a ratio of hydrogen to silane between about 20:1 and about 200:1. Silane gas may be provided at a flow rate between about 0.5 sccm/L and about 5 sccm/L. Hydrogen gas may be provided at a flow rate between about 40 sccm/L and about 400 sccm/L. In certain embodiments, the silane flow rate may be ramped up from a first flow rate to a second flow rate during deposition. In certain embodiments, the hydrogen flow rate may be ramped down from a first flow rate to a second flow rate during deposition. Applying RF power between about 300 mW/cm$^2$ or greater, preferably 600 mW/cm$^2$ or greater, at a chamber pressure between about 1 Torr and about 100 Torr, preferably between about 3 Torr and about 20 Torr, more preferably between about 4 Torr and about 12 Torr, will generally deposit an intrinsic type microcrystalline silicon layer having crystalline fraction between about 20 percent and about 80 percent, preferably between about 55 percent and about 75 percent, at a rate of about 200 Å/min or more, preferably about 500 Å/min. In some embodiments, it may be advantageous to ramp the power density of the applied RF power from a first power density to a second power density during deposition.

An intrinsic type microcrystalline silicon layer may be deposited in multiple steps, each having different crystal fraction. In one embodiment, for example, the ratio of hydrogen to silane may be reduced in four steps from 100:1 to 95:1 to 90:1 and then to 85:1. In one embodiment, silane gas may be provided at a flow rate between about 0.1 sccm/L and about 5 sccm/L, such as about 0.97 sccm/L. Hydrogen gas may be provided at a flow rate between about 10 sccm/L and about 200 sccm/L, such as between about 80 sccm/L and about 105 sccm/L. In an exemplary embodiment wherein the deposition has multiple steps, such as four steps, the hydrogen gas flow may start at about 97 sccm/L in the first step, and be gradually reduced to about 92 sccm/L, 88 sccm/L, and 83 sccm/L respectively in the subsequent process steps. Applying RF power between about 300 mW/cm$^2$ or greater, such as about 490 mW/cm$^2$ at a chamber pressure between about 1 Torr and about 100 Torr, for example between about 3 Torr and about 20 Torr, such as between about 4 Torr and about 12 Torr, such as about 9 Torr, will result in deposition of an intrinsic type microcrystalline silicon layer at a rate of about 200 Å/min or more, such as 400 Å/min.

Charge collection is generally provided by doped semiconductor layers, such as silicon layers doped with p-type or n-type dopants. P-type dopants are generally group III elements, such as boron or aluminum. N-type dopants are generally group V elements, such as phosphorus, arsenic, or antimony. In most embodiments, boron is used as the p-type dopant and phosphorus as the n-type dopant. These dopants may be added to the layers described above by including boron-containing or phosphorus-containing compounds in the reaction mixture. Suitable boron and phosphorus compounds generally comprise substituted and unsubstituted lower borane and phosphine oligomers. Some suitable boron compounds include trimethylboron ($B(CH_3)_3$ or TMB), diborane ($B_2H_6$), boron trifluoride ($BF_3$), and triethylboron ($B(C_2H_5)_3$ or TEB). Phosphine is the most common phosphorus compound. The dopants are generally provided with carrier gases, such as hydrogen, helium, argon, and other suitable gases. If hydrogen is used as the carrier gas, it adds to the total hydrogen in the reaction mixture. Thus hydrogen ratios will include hydrogen used as a carrier gas for dopants.

Dopants will generally be provided as dilute gas mixtures in an inert gas. For example, dopants may be provided at molar or volume concentrations of about 0.5% in a carrier gas. If a dopant is provided at a volume concentration of 0.5% in a carrier gas flowing at 1.0 sccm/L, the resultant dopant flow rate will be 0.005 sccm/L. Dopants may be provided to a reaction chamber at flow rates between about 0.0002 sccm/L and about 0.1 sccm/L depending on the degree of doping desired. In general, dopant concentration is maintained between about $10^{18}$ atoms/cm$^2$ and about $10^{20}$ atoms/cm$^2$.

A p-type microcrystalline silicon layer may be deposited by providing a gas mixture of hydrogen gas and silane gas in a ratio of hydrogen-to-silane of about 200:1 or greater, such as 1000:1 or less, for example between about 250:1 and about 800:1, and in a further example about 601:1 or about 401:1. Silane gas may be provided at a flow rate between about 0.1 sccm/L and about 0.8 sccm/L, such as between about 0.2 sccm/L and about 0.38 sccm/L. Hydrogen gas may be provided at a flow rate between about 60 sccm/L and about 500 sccm/L, such as about 143 sccm/L. TMB may be provided at a flow rate between about 0.0002 sccm/L and about 0.0016 sccm/L, such as about 0.00115 sccm/L. If TMB is provided in a 0.5% molar or volume concentration in a carrier gas, then the dopant/carrier gas mixture may be provided at a flow rate between about 0.04 sccm/L and about 0.32 sccm/L, such as about 0.23 sccm/L. Applying RF power between about 50 mW/cm$^2$ and about 700 mW/cm$^2$, such as between about 290 mW/cm$^2$ and about 440 mW/cm$^2$, at a chamber pressure between about 1 Torr and about 100 Torr, preferably between about 3 Torr and about 20 Torr, more preferably between 4 Torr and about 12 Torr, such as about 7 Torr or about 9 Torr, will deposit a p-type microcrystalline layer having crystalline fraction between about 20 percent and about 80 percent, preferably between 50 percent and about 70 percent for a microcrystalline layer, at about 100 Å/min or more, such as about 143 Å/min or more.

A p-type amorphous silicon layer may be deposited by providing a gas mixture of hydrogen gas to silane gas in a ratio of about 20:1 or less. Silane gas may be provided at a flow rate between about 1 sccm/L and about 10 sccm/L. Hydrogen gas may be provided at a flow rate between about 5 sccm/L and 60 sccm/L. Trimethylboron may be provided at a flow rate between about 0.005 sccm/L and about 0.05 sccm/L. If trimethylboron is provided in a 0.5% molar or volume concentration in a carrier gas, then the dopant/carrier gas mixture may be provided at a flow rate between about 1 sccm/L and about 10 sccm/L. Applying RF power between about 15 mWatts/cm$^2$ and about 200 mWatts/cm$^2$ at a chamber pressure between about 0.1 Torr and 20 Torr, preferably between about 1 Torr and about 4 Torr, will deposit a p-type amorphous silicon layer at about 100 Å/min or more.

An n-type microcrystalline silicon layer may be deposited by providing a gas mixture of hydrogen gas to silane gas in a ratio of about 100:1 or more, such as about 500:1 or less, such as between about 150:1 and about 400:1, for example about 304:1 or about 203:1. Silane gas may be provided at a flow rate between about 0.1 sccm/L and about 0.8 sccm/L, such as between about 0.32 sccm/L and about 0.45 sccm/L, for example about 0.35 sccm/L. Hydrogen gas may be provided at a flow rate between about 30 sccm/L and about 250 sccm/L, such as between about 68 sccm/L and about 143 sccm/L, for example about 71.43 sccm/L. Phosphine may be provided at a flow rate between about 0.0005 sccm/L and about 0.006 sccm/L, such as between about 0.0025 sccm/L and about 0.015 sccm/L, for example about 0.005 sccm/L. In other words, if phosphine is provided in a 0.5% molar or volume concentration in a carrier gas, then the dopant/carrier gas may be provided at a flow rate between about 0.1 sccm/L and about 5 sccm/L, such as between about 0.5 sccm/L and about 3 sccm/L, for example between about 0.9 sccm/L and about 1.088 sccm/L. Applying RF power between about 100 mW/cm$^2$ and about 900 mW/cm$^2$, such as about 370 mW/cm$^2$, at a chamber pressure of between about 1 Torr and about 100 Torr, preferably between about 3 Torr and about 20 Torr, more preferably between 4 Torr and about 12 Torr, for example about 6 Torr or about 9 Torr, will deposit an n-type microcrystalline silicon layer having a crystalline fraction between about 20 percent and about 80 percent, preferably between about 50 percent and about 70 percent, at a rate of about 50 Å/min or more, such as about 150 Å/min or more.

An n-type amorphous silicon layer may be deposited by providing a gas mixture of hydrogen gas to silane gas in a ratio of about 20:1 or less, such as about 5.5:1 or 7.8:1. Silane gas may be provided at a flow rate between about 0.1 sccm/L and about 10 sccm/L, such as between about 1 sccm/L and about 10 sccm/L, between about 0.1 sccm/L and about 5 sccm/L, or between about 0.5 sccm/L and about 3 sccm/L, for example about 1.42 sccm/L or about 5.5 sccm/L. Hydrogen gas may be provided at a flow rate between about 1 sccm/L and about 40 sccm/L, such as between about 4 sccm/L and about 40 sccm/L, or between about 1 sccm/L and about 10 sccm/L, for example about 6.42 sccm/L or about 27 sccm/L. Phosphine may be provided at a flow rate between about 0.0005 sccm/L and about 0.075 sccm/L, such as between about 0.0005 sccm/L and about 0.0015 sccm/L or between about 0.015 sccm/L and about 0.03 sccm/L, for example about 0.0095 sccm/L or about 0.023 sccm/L. If phosphine is provided in a 0.5% molar or volume concentration in a carrier gas, then the dopant/carrier gas mixture may be provided at a flow rate between about 0.1 sccm/L and about 15 sccm/L, such as between about 0.1 sccm/L and about 3 sccm/L, between about 2 sccm/L and about 15 sccm/L, or between about 3 sccm/L and about 6 sccm/L, for example about 1.9 sccm/L or about 4.71 sccm/L. Applying RF power between about 25 mW/cm$^2$ and about 250 mW/cm$^2$, such as about 60 mW/cm$^2$ or about 80 mW/cm$^2$, at a chamber pressure between about 0.1 Torr and about 20 Torr, preferably between about 0.5 Torr and about 4 Torr, such as about 1.5 Torr, will deposit an n-type amorphous silicon layer at a rate of about 100 Å/min or more, such as about 200 Å/min or more, such as about 300 Å/min or about 600 Å/min.

In some embodiments, layers may be heavily doped or degenerately doped by supplying dopant compounds at high rates, for example at rates in the upper part of the recipes described above. It is thought that degenerate doping improves charge collection by providing low-resistance contact junctions. Degenerate doping is also thought to improve conductivity of some layers, such as amorphous layers.

In some embodiments, alloys of silicon with other elements such as oxygen, carbon, nitrogen, and germanium may be useful. These other elements may be added to silicon films by supplementing the reactant gas mixture with sources of each. For example, carbon may be added to the film by adding a carbon source such as methane ($CH_4$) to the gas mixture. In general, most $C_1$-$C_4$ hydrocarbons may be used as carbon sources. Alternately, organosilicon compounds known to the art, such as organosilanes, organosiloxanes, organosilanols, and the like may serve as both silicon and carbon sources. Germanium compounds such as germanes and organogermanes, along with compounds comprising silicon and germanium, such as silylgermanes or germylsilanes, may serve as germanium sources. Oxygen gas ($O_2$) may serve as an oxygen source. Other oxygen sources include, but are not limited to, oxides of nitrogen (nitrous oxide —$N_2O$, nitric oxide —NO, dinitrogen trioxide —$N_2O_3$, nitrogen dioxide —$NO_2$, dinitrogen tetroxide —$N_2O_4$, dinitrogen pentoxide —$N_2O_5$, and nitrogen trioxide —$NO_3$), hydrogen peroxide ($H_2O_2$), carbon monoxide or dioxide (CO or $CO_2$), ozone ($O_3$), oxygen atoms, oxygen radicals, and alcohols (ROH, where R is any organic or hetero-organic radical group). Nitrogen sources may include nitrogen gas ($N_2$), ammonia ($NH_3$), hydrazine ($N_2H_2$), amines ($R_xNR'_{3-x}$, where x is 0 to 3, and each R and R' is independently any organic or hetero-organic radical group), amides (($RCO)_xNR'_{3-x}$, where x is 0 to 3 and each R and R' is independently any organic or hetero-organic radical group), imides (RCONCOR', where each R and R' is independently any organic or hetero-organic radical group), enamines ($R_1R_2C=CR_3NR_4R_5$, where each $R_1$-$R_5$ is independently any organic or hetero-organic radical group), and nitrogen atoms and radicals.

Embodiments of the invention also provide a method for forming crystalline silicon based solar cells, which are typically formed by depositing one or more doped silicon layer(s), passivation layers, anti-reflection coating (ARC) layers and/or metallization layers on a crystalline silicon substrate. Thus, embodiments of the invention can be used to remove layers of oxide, along with other impurities, from a crystalline solar cell substrate surface during different phases of the crystalline solar cell formation process. For example, embodiments of the invention may be beneficial for removing oxides from a crystalline silicon substrate prior to forming one or more layers thereon, such as an amorphous silicon layer, a crystalline silicon layer, a high quality passivation layer or an anti-reflection coating layer. In another example, it may be desirable to clean the surface of the crystalline silicon substrate prior to forming one or more of the layers used to form portions of a heterojunction solar cell device thereon. The layer formation processes used to form layers on a crystalline silicon substrate will generally be similar to the processes described above. Crystalline solar cell substrates that may benefit from the invention include, but are not limited to substrates that have a portion of the active region of the solar cell device that is formed from single crystal silicon, multi-crystalline silicon, polycrystalline silicon, or other similar substrate materials that can be used to convert sunlight to electrical power.

It should be noted that in many embodiments pre-clean processes may be used to prepare substrates and/or reaction chambers for deposition of the above layers. A hydrogen or argon plasma pre-treat process may be performed to remove contaminants from substrates and/or chamber walls by supplying hydrogen gas or argon gas to the processing chamber between about 10 sccm/L and about 45 sccm/L, such as between about 15 sccm/L and about 40 sccm/L, for example about 20 sccm/L and about 36 sccm/L. In one example, the hydrogen gas may be supplied at about 21 sccm/L or the argon gas may be supplied at about 36 sccm/L. The treatment is accomplished by applying RF power between about 10 $mW/cm^2$ and about 250 $mW/cm^2$, such as between about 25 $mW/cm^2$ and about 250 $mW/cm^2$, for example about 60 $mW/cm^2$ or about 80 $mW/cm^2$ for hydrogen treatment and about 25 $mW/cm^2$ for argon treatment. In many embodiments it may be advantageous to perform an argon plasma pre-treatment process prior to depositing a p-type amorphous silicon layer, and a hydrogen plasma pre-treatment process prior to depositing other types of layers.

Dry Cleaning of Solar Cell Layers

A solar cell layer having a native layer formed thereon may be cleaned using a dry cleaning process. In general, a nitrogen and fluorine containing gas is subjected to dissociative energy at a location remote from the substrate to form neutrally charged active species, such as radicals. The neutrally charged active species are directed toward the substrate, reacted with the substrate surface to form a film, and the substrate is heat treated to remove the film.

Figure 1A:
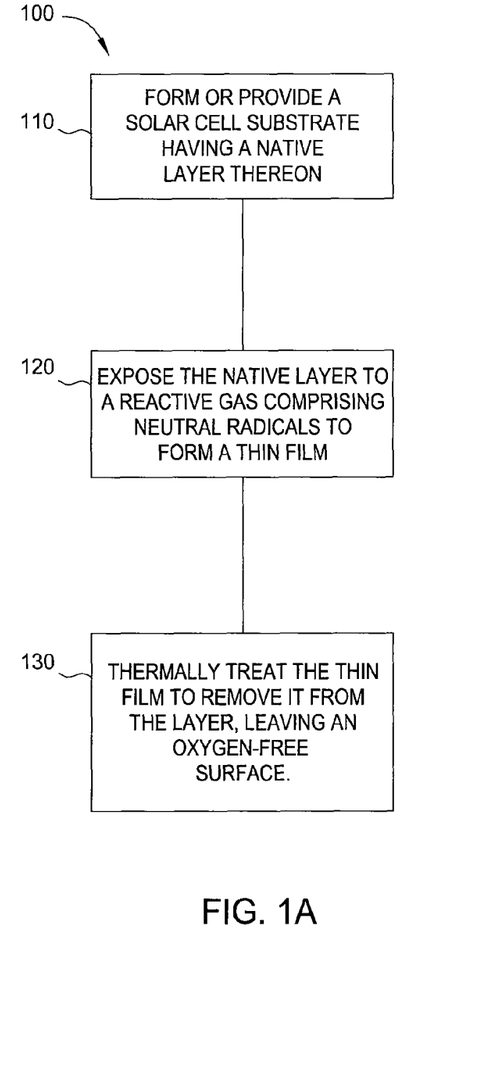
FIG. 1A is a flow diagram summarizing a method according to one embodiment of the invention.
Figure 1B:
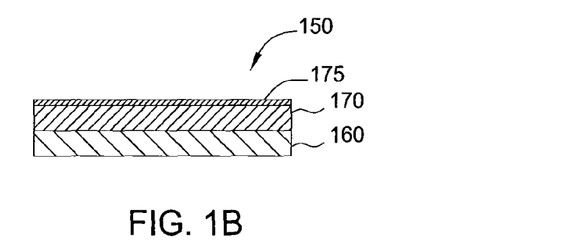
FIGS. 1B-1D are schematic side-views of a substrate at various stages of the method of FIG. 1A.
Figure 1C:
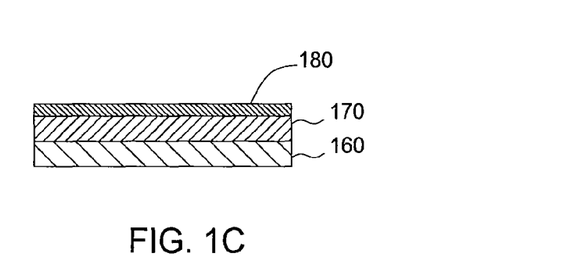
Figure 1D:
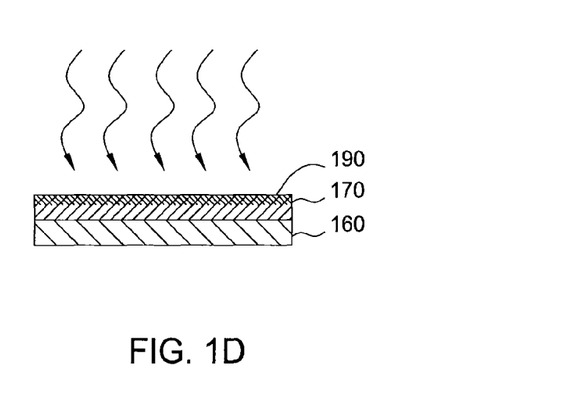

FIG. 1A is a flow diagram summarizing a method 100 according to one embodiment of the invention. FIGS. 1B-1D are schematic cross-sectional views of a solar cell substrate 150 at various stages of the method 100. A layer 170 of a solar cell junction is formed on a solar cell substrate 160 at 110. The layer 170 may be any of the layers described above. In many embodiments, a deposited layer in a solar cell substrate will acquire a native layer 175, such as a native oxide layer, during transportation from one processing location to another. In many embodiments, this will occur after formation of the last layer of a solar cell junction, such as a p-type or n-type doped layer. In other embodiments, this will occur prior to forming one or more conductor layers, such as after a heavily, or degeneratively, doped p-type layer is formed. It should be noted that while the various embodiment of the invention described herein are discussed in relation to cleaning a surface of a deposited layer, such as layer 170, this configuration is not intended to limit the scope of the invention, since the apparatus and cleaning process(es) described herein can be used during any phase of the solar formation process without deviating from the basic scope of the invention described herein. In one example, the processes described herein can be used to prepare the surface of the substrate 160, such as a crystalline silicon substrate, prior to depositing the layer 170 thereon.

After disposing the substrate on a substrate support in a process chamber, the native layer 175 is exposed to a reactive gas at 120 to form a thin film 180 on the native layer 175. The reactive gas comprises nitrogen, fluorine, and hydrogen. In some embodiments, the reactive gas comprises neutral radicals containing nitrogen, fluorine, or both, and is provided to the process chamber having the substrate disposed therein and directed toward the substrate. The thin film generally comprises a solid compound formed by reaction of the neutral radicals with oxygen from the native layer 175.

At 130, the thin film 180 is thermally treated to remove it from the layer 170. In some embodiments, the thermal treatment may be an annealing process. The thin film sublimes away from the layer 170, taking oxygen and other impurities, and leaving a hydrogen-terminated layer 190 behind. In some embodiments, the layer 190 may also have fluorine, such as traces of fluorine atoms, after the thermal treatment of 130.

An exemplary reactive cleaning process for removing native oxides on a surface of the substrate using an ammonia ($NH_3$) and nitrogen trifluoride ($NF_3$) gas mixture performed within a processing chamber will now be described. The reactive cleaning process begins by placing a substrate into a processing chamber. During processing, the substrate may be cooled below about 65° C., such as between about 15° C. and about 50° C. In another example, the substrate is maintained at a temperature of between about 22° C. and about 40° C., such as about 35° C. Typically, the substrate support is maintained below about 22° C. to reach the desired substrate temperatures. In some embodiments, it is useful to maintain a temperature of the substrate below a temperature of the chamber walls during formation of the thin film to prevent condensation of reactive species from the reactive gas on the chamber walls.

A precursor gas mixture comprising ammonia gas and nitrogen trifluoride gas is introduced into the dry etching chamber to form a cleaning gas mixture. The amount of each gas introduced into the chamber is variable and may be adjusted to accommodate, for example, the thickness of the oxide layer to be removed, the geometry of the substrate being cleaned, the volume capacity of the reactive gas mixture and the volume capacity of the chamber body. In one aspect, the gases are added to provide a precursor gas mixture having at least a 1:1 molar ratio of ammonia to nitrogen trifluoride. In another aspect, the molar ratio of the gas mixture is at least about 3 to about 1 (ammonia to nitrogen trifluoride). Preferably, the gases are introduced in the dry etching chamber at a molar ratio of between about 1:1 (ammonia to nitrogen trifluoride) and about 30:1, more preferably, between about 5:1 (ammonia to nitrogen trifluoride) and about 30:1. More preferably, the molar ratio of the gas mixture is between about 5:1 (ammonia to nitrogen trifluoride) and about 10:1. The molar ratio of the gas mixture may also fall between about 10:1 (ammonia to nitrogen trifluoride) and about 20:1. In one exemplary embodiment, ammonia and nitrogen trifluoride are provided to a chamber in a volume ratio of about 5:1. Alternatively, a pre-mixed precursor gas mixture of the preferred molar ratio may be used during the reactive cleaning process.

A purge gas or carrier gas may also be added to the precursor gas mixture. Any suitable purge/carrier gas may be used, such as argon, helium, hydrogen, nitrogen, forming gas, or mixtures thereof. Typically, the volume fraction of ammonia and nitrogen fluoride in the precursor gas mixture ranges from about 0.05% to about 20%. The remainder of the precursor gas mixture may be the carrier gas. In one embodiment, the purge or carrier gas is first introduced into the chamber body before the reactive gases to stabilize the pressure within the chamber body.

The operating pressure within the chamber body can vary. The pressure may be maintained within a range from about 500 mTorr to about 30 Torr, preferably from about 1 Torr to about 10 Torr, and more preferably from about 3 Torr to about 6 Torr, such as about 3 Torr. Dissociative energy is applied to the precursor gas mixture to form a reactive gas mixture. A RF power within a range from about 5 watts to about 600 watts may be applied to ignite a plasma of the precursor gas mixture within the plasma cavity. Preferably, the RF power is less than about 100 watts. More preferable is that the frequency at which the power is applied is very low, such as less than about 100 kHz, and more preferably, within a range from about 50 kHz to about 90 kHz. In most embodiments, the surface of the substrate will be etched (i.e. converted into a thin film of anneal precursor) at a rate of between about 3 Å/sec and about 10 Å/sec, such as about 5 Å/sec.

The plasma energy dissociates the ammonia and nitrogen trifluoride gases into reactive species that combine to form a highly reactive ammonia fluoride ($NH_4F$) compound and/or ammonium hydrogen fluoride ($NH_4F$—HF) which reacts with the substrate surface. The gases dissociate to form charged and uncharged reactive species, and the charged species recombine to produce uncharged reactive species. In one embodiment, the reactive gas mixture comprises nitrogen, fluorine, and hydrogen, and is free of electric charges. In one embodiment, the reactive gas mixture formed by applying dissociative energy to the precursor gas mixture is flowed to the process chamber over any interval sufficient to neutralize at least about 90% of charged active species in the reactive gas. In other embodiments, at least about 99% of charged active species are neutralized. In one embodiment, the carrier gas is first introduced into the dry etch chamber, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4F$—HF, reacts with the native oxide surface to form ammonium hexafluorosilicate (($NH_4)_2SiF_6$), ammonia, and water, while releasing oxygen gas. The ammonia and water are vapors at processing conditions and removed from the chamber by a vacuum pump attached to the chamber. A thin film of ammonium hexafluorosilicate is left behind on the substrate surface.

The thin film of ammonium hexafluorosilicate on the substrate surface may be removed to expose the underlying substrate surface during an anneal process. The processing chamber radiates heat to dissociate or sublimate the thin film of ammonium hexafluorosilicate into volatile $SiF_4$, $NH_3$, and HF products. These volatile products are then removed from the chamber by the vacuum pump attached to the system. In one example, a substrate temperature of about 75° C. or higher is used to effectively sublime and remove the thin film from the substrate. Preferably, a temperature of about 100° C. or higher is used, such a temperature within a range from about 115° C. to about 300° C., such as about 120° C. Higher temperature promotes faster sublimation. In one embodiment, the gas distribution plate is heated to a temperature of about 180° C. and spaced about 100 mils from the substrate to anneal the substrate. Once the film has been removed from the substrate, the chamber is purged and evacuated prior to removing the cleaned substrate. During the anneal process, the substrate may be maintained under vacuum, or may be exposed to hydrogen gas, depending on the embodiment. Removal of the thin film removes oxygen from the substrate surface and deposits hydrogen, fluorine, or both on the substrate surface.

In some embodiments, the anneal process may be performed on a side of the substrate opposite the side on which the cleaning film is deposited. For example, if a first side of the substrate is subjected to the neutral radical dry clean process described above, wherein a thin film is formed on the first side, a second side of the substrate, opposite the first side, may be heated to perform the anneal process. Annealing from the second side may improve crystallization of the layer subjected to cleaning by promoting diffusion and crystal lattice ordering in the layer as the thin film on the first side is sublimed.

In some embodiments, it may be useful to supplement the process gas with hydrogen ($H_2$). Addition of hydrogen to the process gas promotes the concentration of hydrogen radicals and hydrogen fluoride in the reactive gas. The presence of these two species in the reaction mix will etch portions of doped silicon layers, while the ammonium fluoride species form hexafluorosilicate on the surface of the substrate. This may improve cleaning, and may also effect removal of dopants from a surface monolayer of the substrate, if that is required by the embodiment. Removing dopants from a surface monolayer of the substrate may be useful in some embodiments by promoting a smooth transition of electrical properties at the interface between the two layers. In some embodiments, a molar ratio of $H_2$:$NH_3$ between about 0.1 and about 1.0 may be used to promote modest etching of the surface during a dry clean process, with higher ratio causing more or faster etching. The molar ratio of hydrogen to ammonia in the reactive gas mixture controls the selectivity of the gas for etching doped silicon layers versus silicon oxide layers. Increasing the molar ratio of hydrogen to ammonia results in faster etching of the doped layer relative to the oxide layer, and vice versa. Addition of hydrogen may also allow selective etching of undoped silicon layers relative to oxide because the hydrogen forms HF in the reactive gas mixture, which etches undoped silicon layers.

Nitrogen and hydrogen gas may be substituted for ammonia in some embodiments. When dissociated, nitrogen and hydrogen may combine to form the ammonium radicals discussed above. Providing hydrogen and nitrogen in a molar ratio of about 3:1 will approximate the effect of ammonia at certain pressures and power levels. Varying the ratio may have beneficial side-effects, depending on the embodiment. For example, when cleaning a doped or heavily doped surface, a higher proportion of hydrogen may improve the etch rate of the doped surface by providing more hydrogen radicals to remove dopants.

Processes described herein may be useful for cleaning surfaces of crystalline or thin film solar cells at various stages of manufacture. In some embodiments, the layer being cleaned may be a layer of a p-i-n junction that forms part of the solar cell, such as a p-type doped silicon layer, an intrinsic silicon layer, or an n-type doped silicon layer. For example, the last layer of a first p-i-n junction may be processed according to embodiments described herein before forming a second p-i-n junction in a tandem thin film solar cell device. Additionally, a heavily doped p-type layer, or a degeneratively doped p-type layer, may be cleaned prior to forming a passivating layer. It is believed that terminating the heavily doped p-type layer with hydrogen and traces of fluorine after cleaning aids in formation of the passivation layer.

Apparatus

Figure 2:
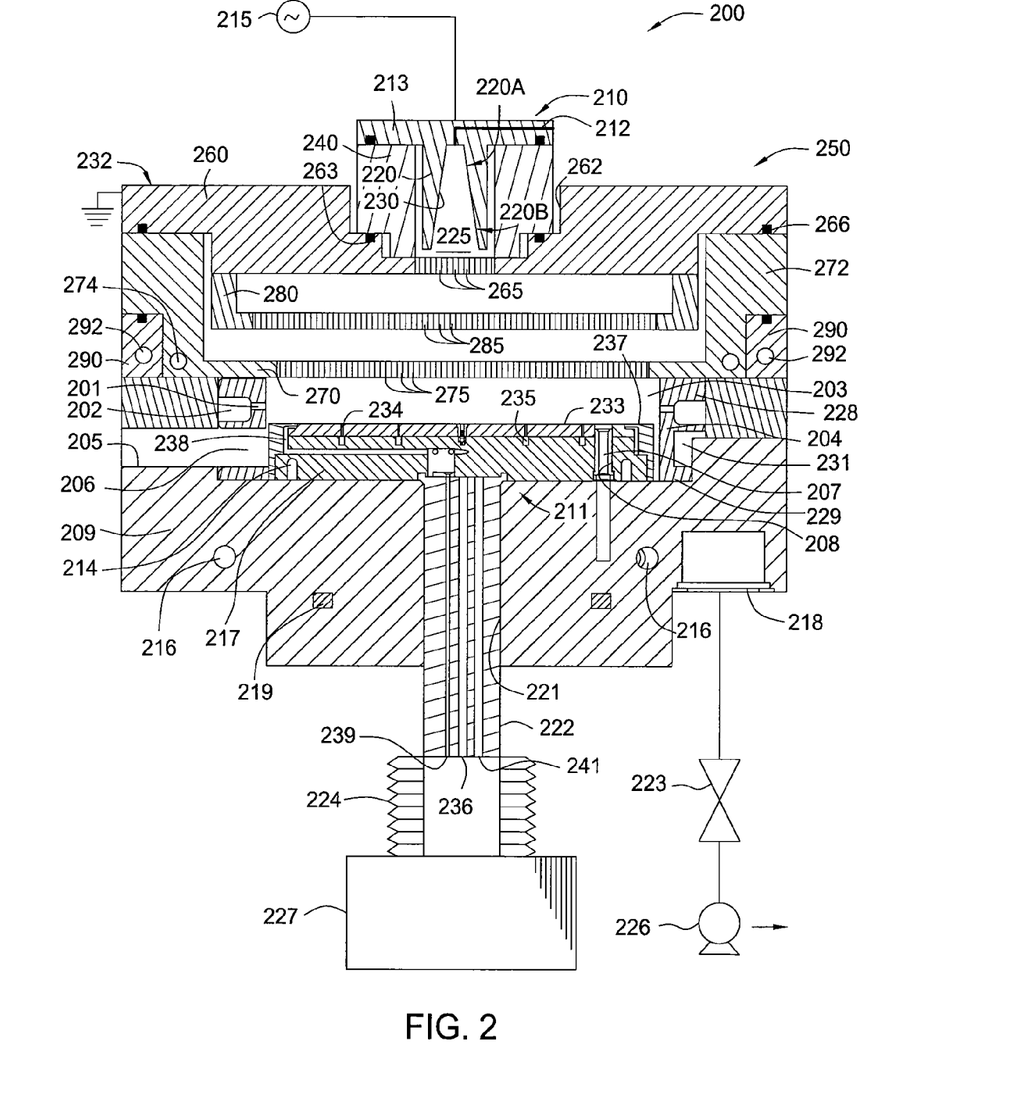
FIG. 2 is a cross-sectional view of a chamber for processing solar cell substrates according to one embodiment of the invention.

A selective etching process may be performed using a vacuum chamber, such as a SICONI™ chamber available from Applied Materials, Inc., located in Santa Clara, Calif. FIG. 2 is a partial cross-sectional view of a processing chamber 200 according to one embodiment of the invention. In this embodiment, processing chamber 200 includes lid assembly 250 disposed at an upper end of chamber body 209, and support assembly 211 at least partially disposed within chamber body 209. The processing chamber 200 and the associated hardware are preferably formed from one or more process-compatible materials, such as aluminum, anodized aluminum, nickel plated aluminum, nickel plated aluminum 6061-T6, stainless steel, as well as combinations and alloys thereof, for example.

The chamber body 209 includes a slit valve opening 205 formed in a sidewall thereof to provide access to the interior of the processing chamber 200. The slit valve opening 205 is selectively opened and closed to allow access to the interior of the chamber body 209 by a suitable substrate handling robot (not shown). In one embodiment, a substrate can be transported in and out of the processing chamber 200 through the slit valve opening 205 to an adjacent transfer chamber and/or load-lock chamber, or another chamber within a cluster tool.

In one or more embodiments, the chamber body 209 includes a channel 216 formed therein for flowing a heat transfer fluid therethrough. The heat transfer fluid can be a heating fluid or a coolant and is used to control the temperature of the chamber body 209 during processing and substrate transfer. The temperature of the chamber body 209 is selected to prevent unwanted condensation of the gas or byproducts on the chamber walls. Exemplary heat transfer fluids include water, ethylene glycol, or a mixture thereof. An exemplary heat transfer fluid may also include nitrogen gas.

The chamber body 209 can further include a liner 204 that surrounds the support assembly 211. The liner 204 is preferably removable for servicing and cleaning. The liner 204 can be made of a metal such as aluminum, or a ceramic material. However, the liner 204 can be any process compatible material. The liner 204 can be bead blasted to increase the adhesion of any material deposited thereon, thereby preventing flaking of material which results in contamination of the processing chamber 200. In one or more embodiments, the liner 204 includes one or more apertures 201 and a pumping channel 202 formed therein that is in fluid communication with a vacuum system. The apertures 201 provide a flow path for gases into the pumping channel 202, which provides an egress for the gases within the processing chamber 200.

The vacuum system can include a vacuum pump 226 and a throttle valve 223 to regulate flow of gases through the processing chamber 200. The vacuum pump 226 is coupled to a vacuum port 218 disposed on the chamber body 209, and is therefore in fluid communication with the pumping channel 202 formed within the liner 204. The terms "gas" and "gases" are used interchangeably, unless otherwise noted, and refer to one or more precursors, reactants, catalysts, carrier, purge, cleaning, combinations thereof, as well as any other fluid introduced into the chamber body 209.

In the embodiment of FIG. 2, the liner 204 includes an upper portion 228 and a lower portion 229. An aperture 206 that aligns with the slit valve opening 205 disposed on a side wall of the chamber body 209 is formed within the liner 204 to allow entry and egress of substrates to/from the chamber body 209. Typically, the pumping channel 202 is formed within the upper portion 228. The upper portion 228 also includes the one or more apertures 201 formed therethrough to provide passageways or flow paths for gases into the pumping channel 202.

The apertures 201 allow the pumping channel 202 to be in fluid communication with a processing zone 203 within the chamber body 209. The processing zone 203 is defined by a lower surface of the lid assembly 250 and an upper surface of the support assembly 211, and is surrounded by the liner 204. The apertures 201 may be uniformly sized and evenly spaced about the liner 204. However, any number, position, size or shape of apertures may be used, and each of those design parameters can vary depending on the desired flow pattern of gas across the substrate receiving surface as is discussed in more detail below. In addition, the size, number and position of the apertures 201 are configured to achieve uniform flow of gases exiting the processing chamber 200. Further, the aperture size and location may be configured to provide rapid or high capacity pumping to facilitate a rapid exhaust of gas from the chamber 200. For example, the number and size of apertures 201 in close proximity to the vacuum port 218 may be smaller than the size of apertures 201 positioned farther away from the vacuum port 218.

The lower portion 229 of the liner 204 includes a flow path or vacuum channel 231 disposed therein. The vacuum channel 231 is in fluid communication with the vacuum system described above. The vacuum channel 231 is also in fluid communication with the pumping channel 202 via a recess or port (not shown in the cross-section of FIG. 2) formed in an outer diameter of the liner 204 and connecting the vacuum channel 231 and the pumping channel 202. Generally, two such portals are formed in an outer diameter of the liner 204 between the upper portion 228 and the lower portion 229. The portals provide a flow path between the pumping channel 202 and the vacuum channel 231. The size and location of each portal is a matter of design, and is determined by the stoichiometry of a desired film, the geometry of the device being formed, the volume capacity of the processing chamber 200 as well as the capabilities of the vacuum system coupled thereto. Typically, the portals are arranged opposite one another or 180 degrees apart about the outer diameter of the liner 204.

In operation, one or more gases exiting the processing chamber 200 flow through the apertures 201 formed through the upper portion 228 of the liner 204 into the pumping channel 202. The gas then flows within the pumping channel 202 and into the vacuum channel 231. The gas exits the vacuum channel 231 through the vacuum port 218 into the vacuum pump 226.

Support assembly 211 is partially disposed within chamber body 209, and positions a substrate for processing. Support assembly 211, comprising support member 217, is raised and lowered by shaft 222 which is enclosed by bellows 224. Chamber body 209 includes slit valve opening 205 formed in a sidewall thereof to provide access to the interior of processing chamber 200. Slit valve opening 205 is selectively opened and closed to allow access to the interior of chamber body 209 by a substrate handling robot (not shown). In one embodiment, a substrate may be transported in and out of processing chamber 200 through slit valve opening 205 to an adjacent transfer chamber and/or load-lock chamber (not shown), or another chamber within a cluster tool. Illustrative cluster tools include but are not limited to the PRODUCER®, CENTURA®, ENDURA®, and ENDURA SL™ platforms, available from Applied Materials, Inc., located in Santa Clara, Calif.

Chamber body 209 also includes channel 216 formed therein for flowing a heat transfer fluid therethrough. The heat transfer fluid may be a heating fluid or a coolant and is used to control the temperature of chamber body 209 during processing and substrate transfer. The temperature of chamber body 209 is selected to prevent unwanted condensation of the gas or byproducts on the chamber walls. Exemplary heat transfer fluids include water, ethylene glycol, or a mixture thereof. An exemplary heat transfer fluid may also include nitrogen gas.

Chamber body 209 further includes a liner 204 that surrounds support assembly 211, and is removable for servicing and cleaning. Liner 204 is preferably made of a metal such as aluminum, or a ceramic material. However, other materials which are compatible may be used during the process. Liner 204 may be bead blasted to increase the adhesion of any material deposited thereon, thereby preventing flaking of material which results in contamination of processing chamber 200. Liner 204 typically includes one or more apertures 201 and a pumping channel 202 formed therein that is in fluid communication with a vacuum system. Apertures 201 provide a flow path for gases into pumping channel 202, and the pumping channel provides a flow path through liner 204 so the gases can exit processing chamber 200.

The vacuum system may comprise vacuum pump 226 and throttle valve 223 to regulate flow of gases within processing chamber 200. Vacuum pump 226 is coupled to a vacuum port 218 disposed on chamber body 209, and is in fluid communication with pumping channel 202 formed within liner 204. Vacuum pump 226 and chamber body 209 are selectively isolated by throttle valve 223 to regulate flow of the gases within processing chamber 200. The terms "gas" and "gases" may be used interchangeably, unless otherwise noted, and refer to one or more precursors, reactants, catalysts, carrier, purge, cleaning, combinations thereof, as well as any other fluid introduced into chamber body 209.

The lid assembly 250 includes at least two stacked components configured to form a plasma volume or cavity therebetween. In one or more embodiments, the lid assembly 250 includes a first electrode 210 ("upper electrode") disposed vertically above a second electrode 232 ("lower electrode") confining a plasma volume or cavity 225 therebetween. The first electrode 210 is connected to a power source 215, such as an RF power supply, and the second electrode 232 is connected to ground, forming a capacitance between the two electrodes 210, 232.

In one or more embodiments, the lid assembly 250 includes one or more gas inlets 212 (only one is shown) that are at least partially formed within an upper section 213 of the first electrode 210. The one or more process gases enter the lid assembly 250 via the one or more gas inlets 212. The one or more gas inlets 212 are in fluid communication with the plasma cavity 225 at a first end thereof and coupled to one or more upstream gas sources and/or other gas delivery components, such as gas mixers, at a second end thereof. The first end of the one or more gas inlets 212 can open into the plasma cavity 225 at the upper most point of the inner diameter 230 of the expanding section 220. Similarly, the first end of the one or more gas inlets 212 can open into the plasma cavity 225 at any height interval along the inner diameter 230 of the expanding section 220. Although not shown, two gas inlets 212 can be disposed at opposite sides of the expanding section 220 to create a swirling flow pattern or "vortex" flow into the expanding section 220 which helps mix the gases within the plasma cavity 225.

In one or more embodiments, the first electrode 210 has an expanding section 220 that houses the plasma cavity 225. The expanding section 220 is in fluid communication with the gas inlet 212 as described above. In one or more embodiments, the expanding section 220 is an annular member that has an inner surface or diameter 230 that gradually increases from an upper portion 220A thereof to a lower portion 220B thereof. As such, the distance between the first electrode 210 and the second electrode 232 is variable. That varying distance helps control the formation and stability of the plasma generated within the plasma cavity 225.

In one or more embodiments, the expanding section 220 resembles a cone or "funnel". In one or more embodiments, the inner surface 230 of the expanding section 220 gradually slopes from the upper portion 220A to the lower portion 220B of the expanding section 220. The slope or angle of the inner diameter 230 can vary depending on process requirements and/or process limitations. The length or height of the expanding section 220 can also vary depending on specific process requirements and/or limitations. In one or more embodiments, the slope of the inner diameter 230, or the height of the expanding section 220, or both can vary depending on the volume of plasma needed for processing. For example, the slope of the inner diameter 230 can be at least 1:1, or at least 1.5:1 or at least 2:1 or at least 3:1 or at least 4:1 or at least 5:1 or at least 10:1. In one or more embodiments, the slope of the inner diameter 230 can range from a low of 2:1 to a high of 20:1.

In one or more embodiments, the expanding section 220 can be curved or arced although not shown in the figures. For example, the inner surface 230 of the expanding section 220 can be curved or arced to be either convexed or concaved. In one or more embodiments, the inner surface 230 of the expanding section 220 can have a plurality of sections that are each sloped, tapered, convexed, or concaved.

As mentioned above, the expanding section 220 of the first electrode 210 varies the vertical distance between the first electrode 210 and the second electrode 232 because of the gradually increasing inner surface 230 of the first electrode 210. That variable distance is directly related to the power level within the plasma cavity 225. Not wishing to be bound by theory, the variation in distance between the two electrodes 210, 232 allows the plasma to find the necessary power level to sustain itself within some portion of the plasma cavity 225 if not throughout the entire plasma cavity 225. The plasma within the plasma cavity 225 is therefore less dependent on pressure, allowing the plasma to be generated and sustained within a wider operating window. As such, a more repeatable and reliable plasma can be formed within the lid assembly 250.

The first electrode 210 can be constructed from any process compatible materials, such as aluminum, anodized aluminum, nickel plated aluminum, nickel plated aluminum 6061-T6, stainless steel as well as combinations and alloys thereof, for example. In one or more embodiments, the entire first electrode 210 or portions thereof are nickel coated to reduce unwanted particle formation. Preferably, at least the inner surface 230 of the expanding section 220 is nickel plated.

The second electrode 232 can include one or more stacked plates. When two or more plates are desired, the plates should be in electrical communication with one another. Each of the plates should include a plurality of apertures or gas passages to allow the one or more gases from the plasma cavity 225 to flow through.

The lid assembly 250 can further include an isolator ring 240 to electrically isolate the first electrode 210 from the second electrode 232. The isolator ring 240 can be made from aluminum oxide or any other insulative, process compatible material. Preferably, the isolator ring 240 surrounds or substantially surrounds at least the expanding section 220.

The second electrode 232 includes a top plate 260, distribution plate 270 and blocker plate 280. The top plate 260, distribution plate 270 and blocker plate 280 are stacked and disposed on a lid rim 290 which is connected to the chamber body 209. A hinge assembly (not shown) can be used to couple the lid rim 290 to the chamber body 209. The lid rim 290 can include an embedded channel or passage 292 for housing a heat transfer medium. The heat transfer medium can be used for heating, cooling, or both, depending on the process requirements. Illustrative heat transfer mediums are listed above.

In one or more embodiments, the top plate 260 includes a plurality of gas passages or apertures 265 formed beneath the plasma cavity 225 to allow gas from the plasma cavity 225 to flow therethrough. In one or more embodiments, the top plate 260 can include a recessed portion 262 that is adapted to house at least a portion of the first electrode 210. In one or more embodiments, the apertures 265 are through the cross section of the top plate 260 beneath the recessed portion 262. The recessed portion 262 of the top plate 260 can be stair-stepped to provide a better sealed fit therebetween. Furthermore, the outer diameter of the top plate 260 can be designed to mount or rest on an outer diameter of the distribution plate 270. An o-ring type seal, such as an elastomeric o-ring 263, can be at least partially disposed within the recessed portion 262 of the top plate 260 to ensure a fluid-tight contact with the first electrode 210. Likewise, an o-ring type seal 266 can be used to provide a fluid-tight contact between the outer perimeters of the top plate 260 and the distribution plate 270.

In one or more embodiments, the distribution plate 270 is substantially disc-shaped and includes a plurality of apertures 275 or passageways to distribute the flow of gases therethrough. The apertures 275 can be sized and positioned about the distribution plate 270 to provide a controlled and even flow distribution to the chamber body 209 where the substrate to be processed is located. Furthermore, the apertures 275 prevent the gas(es) from impinging directly on the substrate surface by slowing and re-directing the velocity profile of the flowing gases, as well as evenly distributing the flow of gas to provide an even distribution of gas across the surface of the substrate.

The distribution plate 270 can also include an annular mounting flange 272 formed at an outer perimeter thereof. The mounting flange 272 can be sized to rest on an upper surface of the lid rim 290. An o-ring type seal, such as an elastomeric o-ring, can be at least partially disposed within the annular mounting flange 272 to ensure a fluid-tight contact with the lid rim 290.

In one or more embodiments, the distribution plate 270 includes one or more embedded channels or passages 274 for housing a heater or heating fluid to provide temperature control of the lid assembly 250. Similar to the lid assembly 250 described above, a resistive heating element can be inserted within the passage 274 to heat the distribution plate 270. A thermocouple can be connected to the distribution plate 270 to regulate the temperature thereof. The thermocouple can be used in a feedback loop to control electric current applied to the heating element, as described above.

Alternatively, a heat transfer medium can be passed through the passage 274. The one or more passages 274 can contain a cooling medium, if needed, to better control temperature of the distribution plate 270 depending on the process requirements within the chamber body 209. As mentioned above, any heat transfer medium may be used, such as nitrogen, water, ethylene glycol, or mixtures thereof, for example.

In one or more embodiments, the lid assembly 250 can be heated using one or more heat lamps (not shown). Typically, the heat lamps are arranged about an upper surface of the distribution plate 270 to heat the components of the lid assembly 250 including the distribution plate 270 by radiation.

The blocker plate 280 is optional and would be disposed between the top plate 260 and the distribution plate 270. Preferably, the blocker plate 280 is removably mounted to a lower surface of the top plate 260. The blocker plate 280 should make good thermal and electrical contact with the top plate 260. In one or more embodiments, the blocker plate 280 can be coupled to the top plate 260 using a bolt or similar fastener. The blocker plate 280 can also be threaded or screwed onto an out diameter of the top plate 260.

The blocker plate 280 includes a plurality of apertures 285 to provide a plurality of gas passages from the top plate 260 to the distribution plate 270. The apertures 285 can be sized and positioned about the blocker plate 280 to provide a controlled and even flow distribution the distribution plate 270.

The confinement of the plasma within the plasma cavity 225 and the central location of the confined plasma allows an even and repeatable distribution of the disassociated gas(es) into the chamber body 209. Particularly, the gas leaving the plasma cavity 225 flows through the apertures 265 of the top plate 260 to the upper surface of the blocker plate 280. The apertures 285 of the blocker plate 280 distribute the gas to the backside of the distribution plate 270 where the gas is further distributed through the apertures 275 of the distribution plate 270 before contacting the substrate (not shown) within the chamber body 209. It is believed that the confinement of the plasma within the centrally located plasma cavity 225 and the variable distance between the first electrode 210 and the second electrode 232 generate a stable and reliable plasma within the lid assembly 250.

The support assembly 211 can be at least partially disposed within the chamber body 209. The support assembly 211 can include a support member 217 to support a substrate (not shown in this view) for processing within the chamber body 209. The support member 217 can be coupled to a lift mechanism 227 through a shaft 222 which extends through a centrally-located opening 221 formed in a bottom surface of the chamber body 209. The lift mechanism 227 can be flexibly sealed to the chamber body 209 by a bellows 224 that prevents vacuum leakage from around the shaft 222. The lift mechanism 227 allows the support member 217 to be moved vertically within the chamber body 209 between a process position and a lower, transfer position. The transfer position is slightly below the opening of the slit valve 205 formed in a sidewall of the chamber body 209.

In one or more embodiments, the support member 217 has a flat, circular surface or a substantially flat, circular surface for supporting a substrate to be processed thereon. The support member 217 is preferably constructed of aluminum. The support member 217 can include a removable top plate 233 made of some other material, such as silicon or ceramic material, for example, to reduce backside contamination of the substrate.

In one or more embodiments, the support member 217 or the top plate 233 can include a plurality of extensions or dimples (not shown) arranged on the upper surface thereof. The dimples can be arranged on the upper surface of the support member 217 if a top plate 233 is not desired. The dimples provide minimum contact between the lower surface of the substrate and the support surface of the support assembly 211 (i.e. either the support member 217 or the top plate 233), if minimum contact is desired.

In one or more embodiments, the substrate (not shown) may be secured to the support assembly 211 using a vacuum chuck. The top plate 233 can include a plurality of holes 234 in fluid communication with one or more grooves 235 formed in the support member 217. The grooves 235 are in fluid communication with a vacuum pump (not shown) via a vacuum conduit 236 disposed within the shaft 222 and the support member 217. Under certain conditions, the vacuum conduit 236 can be used to supply a purge gas to the surface of the support member 217 to prevent deposition when a substrate is not disposed on the support member 217. The vacuum conduit 236 can also pass a purge gas during processing to prevent a reactive gas or byproduct from contacting the backside of the substrate.

In one or more embodiments, the substrate (not shown) may be secured to the support member 217 using an electrostatic chuck. In one or more embodiments, the substrate can be held in place on the support member 217 by a mechanical clamp (not shown), such as a conventional clamp ring.

Preferably, the substrate is secured using an electrostatic chuck. An electrostatic chuck typically includes at least a dielectric material that surrounds an electrode (not shown), which may be located on an upper surface of the support member 217 or formed as an integral part of the support member 217. The dielectric portion of the chuck electrically insulates the chuck electrode from the substrate and from the remainder of the support assembly 211.

In one or more embodiments, the perimeter of the chuck dielectric can be is slightly smaller than the perimeter of the substrate. In other words, the substrate slightly overhangs the perimeter of the chuck dielectric so that the chuck dielectric will remain completely covered by the substrate even if the substrate is misaligned off center when positioned on the chuck. Assuring that the substrate completely covers the chuck dielectric ensures that the substrate shields the chuck from exposure to potentially corrosive or damaging substances within the chamber body 209.

The voltage for operating the electrostatic chuck can be supplied by a separate "chuck" power supply (not shown). One output terminal of the chucking power supply is connected to the chuck electrode. The other output terminal typically is connected to electrical ground, but alternatively may be connected to a metal body portion of the support assembly 211. In operation, the substrate is placed in contact with the dielectric portion, and a direct current voltage is placed on the electrode to create the electrostatic attractive force or bias to adhere the substrate on the upper surface of the support member 217.

The support member 217 can include one or more bores 208 formed therethrough to accommodate a lift pin 207. Each lift pin 207 is typically constructed of ceramic or ceramic-containing materials, and are used for substrate-handling and transport. Each lift pin 207 is slideably mounted within the bore 208. In one aspect, the bore 208 is lined with a ceramic sleeve to help freely slide the lift pin 207. The lift pin 207 is moveable within its respective bore 208 by engaging an annular lift ring 219 disposed within the chamber body 209. The lift ring 219 is movable such that the upper surface of the lift-pin 207 can be located above the substrate support surface of the support member 217 when the lift ring 219 is in an upper position. Conversely, the upper surface of the lift-pins 207 is located below the substrate support surface of the support member 217 when the lift ring 219 is in a lower position. Thus, part of each lift-pin 207 passes through its respective bore 208 in the support member 217 when the lift ring 219 moves from either the lower position to the upper position.

When activated, the lift pins 207 push against a lower surface of the substrate, lifting the substrate off the support member 217. Conversely, the lift pins 207 may be de-activated to lower the substrate, thereby resting the substrate on the support member 217. The lift pins 207 can include enlarged upper ends or conical heads to prevent the pins 207 from falling out from the support member 217. Other pin designs can also be utilized and are well known to those skilled in the art.

In one embodiment, one or more of the lift pins 207 include a coating or an attachment disposed thereon that is made of a non-skid or highly frictional material to prevent the substrate from sliding when supported thereon. A preferred material is a high temperature, polymeric material that does not scratch or otherwise damage the backside of the substrate which would create contaminants within the processing chamber 200. Preferably, the coating or attachment is KALREZ™ coating available from DuPont.

To drive the lift ring 219, an actuator, such as a conventional pneumatic cylinder or a stepper motor (not shown), is generally used. The stepper motor or cylinder drives the lift ring 219 in the up or down positions, which in turn drives the lift-pins 207 that raise or lower the substrate. In a specific embodiment, a substrate (not shown) is supported on the support member 217 by three lift-pins 207 (not shown in this view) dispersed approximately 120 degrees apart and projecting from the lift ring 219.

The support assembly 211 can include an edge ring 237 disposed about the support member 217. The edge ring 237 can be made of a variety of materials such as ceramic, quartz, aluminum and steel, among others. In one or more embodiments, the edge ring 237 is an annular member that is adapted to cover an outer perimeter of the support member 217 and protect the support member 217 from deposition. The edge ring 237 can be positioned on or adjacent the support member 217 to form an annular purge gas channel 238 between the outer diameter of support member 217 and the inner diameter of the edge ring 237. The annular purge gas channel 238 can be in fluid communication with a purge gas conduit 239 formed through the support member 217 and the shaft 222. Preferably, the purge gas conduit 239 is in fluid communication with a purge gas supply (not shown) to provide a purge gas to the purge gas channel 238. Any suitable purge gas such as nitrogen, argon, or helium, may be used alone or in combination. In operation, the purge gas flows through the conduit 239, into the purge gas channel 238, and about an edge of the substrate disposed on the support member 217. Accordingly, the purge gas working in cooperation with the edge ring 237 prevents deposition at the edge and/or backside of the substrate.

The temperature of the support assembly 211 is controlled by a fluid circulated through a fluid channel 214 embedded in the body of the support member 217. In one or more embodiments, the fluid channel 214 is in fluid communication with a heat transfer conduit 241 disposed through the shaft 222 of the support assembly 211. Preferably, the fluid channel 214 is positioned about the support member 217 to provide a uniform heat transfer to the substrate receiving surface of the support member 217. The fluid channel 214 and heat transfer conduit 241 can flow heat transfer fluids to either heat or cool the support member 217. Any suitable heat transfer fluid may be used, such as water, nitrogen, ethylene glycol, or mixtures thereof. The support assembly 211 can further include an embedded thermocouple (not shown) for monitoring the temperature of the support surface of the support member 217. For example, a signal from the thermocouple may be used in a feedback loop to control the temperature or flowrate of the fluid circulated through the fluid channel 214.

The support member 217 can be moved vertically within the chamber body 209 so that a distance between support member 217 and the lid assembly 250 can be controlled. A sensor (not shown) can provide information concerning the position of support member 217 within chamber 200.

In operation, the support member 217 can be elevated to a close proximity of the lid assembly 250 to control the temperature of the substrate being processed. As such, the substrate can be heated via radiation emitted from the distribution plate 270 that is controlled by the heating element of fluid disposed in the channel 274. Alternatively, the substrate can be lifted off the support member 217 to close proximity of the heated lid assembly 250 using the lift pins 207 activated by the lift ring 219.

Integration

Figure 3:
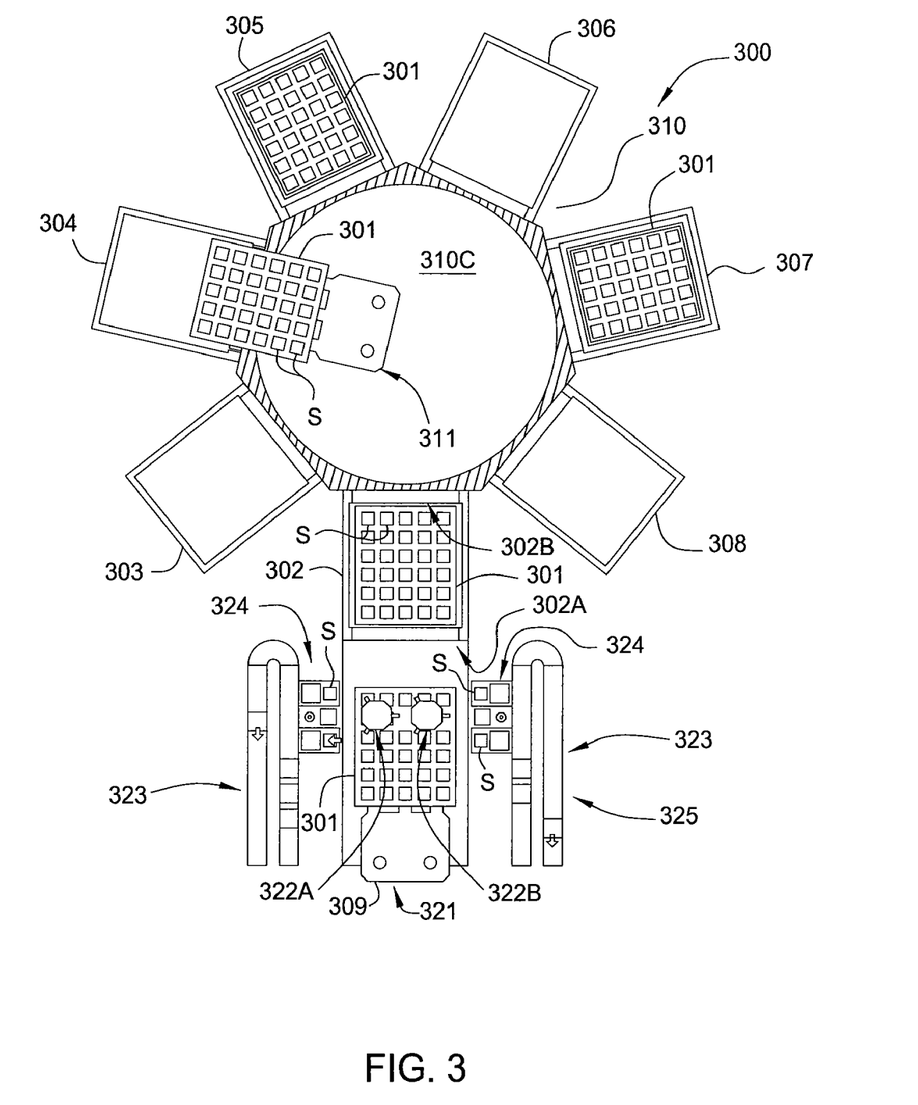
FIG. 3 is a plan view of a system for processing solar cell substrates according to one embodiment of the invention.

FIG. 3 is a plan view of a substrate processing system 300 suitable for performing embodiments of the invention. One suitable processing system that may be adapted to perform one or more of the processing steps and/or transferring steps discussed herein is a processing platform, such as a Gen. 5, Gen. 6, or Gen. 8.5 processing platform, available from the AKT division of Applied Materials, Inc., located in Santa Clara, Calif. The substrate processing system 300 typically includes a transfer chamber 310 that is coupled to a substrate transport interface 325 via a load lock chamber 302. In some embodiments, a substrate processing system may have a multiple transfer chamber configuration, wherein two or more transfer chambers are used to connect multiple processing chambers and substrate transfer interfaces. The transfer chamber 310 generally contains a robot 311 that is adapted to transfer substrates among a plurality of processing chambers (e.g., 303-308) and the load lock chambers (e.g., 302) that are generally selectively sealably coupled to the transferring region 310C of the transfer chamber 310 by use of a slit valve (not shown). Each slit valve is generally configured to selectively isolate the processing region in each of the processing chambers 303-308 from the transferring region 310C, and is generally disposed adjacent to the interface between the processing chambers 303-308 and the transfer chamber 310. In one embodiment, the transfer chamber 310 is maintained at a vacuum condition to eliminate or minimize pressure differences between the transfer chamber 310 and the individual processing chambers 303-308, which are typically used to process the substrates under a vacuum condition. In an alternate embodiment, the transfer chamber 310 and the individual processing chambers 303-308 are used to process the substrates in a clean and inert atmospheric pressure environment. It should be noted that the number and orientation of processing chambers (e.g., reference numerals 303-308) is not intended to limiting as to the scope of the invention, since these configurational details could be adjusted without deviating from the basic scope of the invention described herein.

The embodiment of FIG. 3 comprises a substrate processing system 300 that contains six processing chambers (e.g., reference numerals 303-308), a load lock chamber 302, and a robot 311 disposed within the transferring region 310C of the transfer chamber 310. In one configuration, the processing chambers 303-308 are selected from the group consisting of a physical vapor deposition (PVD) chamber, a plasma enhanced chemical vapor deposition (PECVD) chamber, a hot wire chemical vapor deposition (HWCVD) chamber, a plasma nitridation chamber (DPN), an ion implant/doping chamber, an atomic layer deposition (ALD) chamber, a plasma etching chamber, laser anneal chamber, rapid thermal oxidation/nitridation (RTO/N) chamber, rapid thermal annealing (RTA) chamber, a substrate reorientation chamber (e.g., flipping chamber), a vapor etching chamber, a forming gas or hydrogen annealer, and/or a plasma cleaning chamber. According to one embodiment of the invention, the substrate processing system 300 includes a first process chamber 303 and a second process module 308. In one embodiment, the first process chamber 303 is configured to deposit a specific type of film and the second process module 308 is configured to form a different type of film(s) on a substrate surface. For example, the first process chamber 303 can be used to process one or more silicon-containing films and the second process module 308 can be used to process one or more metal-containing films to form a high quality solar cell junction. In one embodiment, one or more process modules 303-308 may be a low-temperature process module. For example, the silicon surface can be cleaned by a neutral radical process at a low temperature in a first process module and then thermally treated in a second process module, or an amorphous silicon layer may be deposited followed by a silicon nitride layer (the former through thermal or plasma decomposition of silane and the latter through thermal or plasma decomposition of silane with addition of ammonia).

FIG. 3 illustrates one embodiment of a substrate processing system 300 that is adapted to transfer and process a plurality of solar cell substrates, hereafter substrates "S", in groups, or batches, within the processing system 300. FIG. 3 is a plan view of a single transfer chamber type processing system that is adapted to transfer and process a batch of substrates that are positioned on a carrier 301. In one embodiment, the carrier 301 is adapted to hold and retain the substrates during the various transportation and processing steps performed on the substrates within the processing system 300. In this configuration multiple substrates can be transferred, supported, and processed at the same time to improve the system throughput, reduce the number of required transferring steps, and improve the cost of ownership associated with processing and forming a solar cell device.

In one embodiment of the processing system 300, the load lock chamber 302 is coupled to the transfer chamber 310 and a substrate transport interface 325 by couplings 302A and 302B. In general, the substrate transport interface 325 contains one or more robots, such as robots 322A, 322B, that are adapted to receive substrates from the modular conveyor 323 and transfer each of the substrates one at a time, or in groups, to a desired position within the hand-off position 321 so that the loading robotic device 309 can move the substrates into the load lock chamber 302. In one embodiment, the loading robotic device 309 is adapted to position a batch of substrates that have been positioned on a carrier 301, by the robots 322A, 322B, within the load lock chamber 302. In one example, the load lock chamber 302 comprises a plurality of isolatable regions (not shown) that allow the unimpeded movement of multiple carriers 301 into and out-of the load lock chamber 302 from the transfer chamber or the substrate transport interface 325. The couplings 302A and 302B may be slit valves in some embodiments.

The substrate transport interface 325 also generally contains a modular conveyor 323 that is adapted to receive substrates S from the various conveyance systems contained in the solar cell production fab. In general, the modular conveyor 323 is an inter-tool conveyor system that is used to transfer solar cell substrates S between the various processing systems 300 that are positioned in the solar cell fab to form various portions of the solar cell device, or from a cassette or stack of wafers placed in the system. In one example, the modular conveyor 323 is adapted to transfer stacks of solar cell substrates S to a receiving area 324 that is positioned to allow the transfer of substrates S between the robots 322A, 322B and the modular conveyor 323.

In an integrated system such as that described above, the deposition and anneal treatments of the dry cleaning process described above may be performed in the same chamber, or in different chambers. For example, the ammonium hexafluorosilicate film may be developed in a cleaning chamber at a low temperature of between about 10° C. and about 50° C., and the substrate moved to an anneal or deposition chamber at a higher temperature of between about 200° C. and about 300° C. to perform the anneal. A deposition process may then be performed on the cleaned substrate surface in the same deposition chamber without moving the substrate. Such an integrated process avoids heating and cooling problems that can develop while processing large substrates.

In one embodiment, a first layer may be formed on a substrate in one chamber of an integrated processing platform. The substrate may then be moved to a dry cleaning chamber, in which neutral radicals comprising nitrogen and fluorine, formed as described above, are directed toward the substrate to form a thin film on the first layer. Formation of the thin film, as described above, progresses at a low temperature, and releases oxygen from the substrate. The substrate may then be moved to a high temperature chamber, without breaking vacuum, for annealing. In the anneal chamber, heat is applied to the substrate to remove the thin film. The substrate may then be moved to a deposition chamber, without breaking vacuum, to form a second layer.

Such a process sequence may be useful in embodiments where the first layer is a layer of a solar cell junction having a first doping type and the second layer is a layer of a solar cell junction having a second doping type different from the first doping type. For example, the first layer may be an emitter layer and the second layer is a collector layer, or vice versa. In another embodiment, the first layer may be a p-type doped semiconductor layer and the second layer an undoped semiconductor layer. In another embodiment, the first layer may be an n-type doped semiconductor layer and the second layer a p-type doped semiconductor layer. In another embodiment, the first layer may be a heavily doped p-type layer and the second layer a passivating layer.

In another embodiment of the process sequence, a surface of a doped crystalline silicon substrate is cleaned using the steps discussed herein before an alternately doped semiconductor layer is deposited thereon. In one example, a surface of a p-type crystalline silicon substrate is cleaned before an n-type doped semiconductor layer is deposited thereon. In yet another embodiment, a surface of a doped crystalline silicon substrate is cleaned using the steps discussed herein before a passivation layer, comprising silicon oxide is formed or deposited on a surface of a crystalline silicon substrate. In yet another embodiment, a surface of a doped crystalline silicon substrate is cleaned using the steps discussed herein before an anti-reflective coating layer, comprising silicon nitride is deposited on a surface of a crystalline silicon substrate. In yet another embodiment, a surface of a doped crystalline silicon substrate is cleaned using the steps discussed herein before a transparent conductive metal oxide layer, comprising tin oxide ($SnO_x$), zinc oxide ($ZnO_x$), or an AZO layer is deposited on a surface of a crystalline silicon substrate.

HF Vapor Process

In another dry clean process embodiment, a substrate having a native oxide layer or a deposited oxide layer may be cleaned using an HF vapor process. The substrate is positioned in a chamber and a process gas provided to the chamber. The process gas generally comprises anhydrous HF vapor and water vapor. In some embodiments, alcohols may be used to supplement, or in place of, the water vapor. In some embodiments, a carrier gas may be provided as well.

A process gas mixture for an HF vapor clean process generally has a molar ratio of HF to hydroxide groups (OH) of between about 0.5 to about 10, such as between about 1.0 and about 3.0, for example about 2.0. The OH may be provided by water vapor, or by alcohols such as methanol, ethanol, or lower diols and silanols. The polar OH groups catalyze the acid-base reaction between HF and $SiO_2$ that produces $SiF_4$ and water. The water and $SiF_4$ are removed as gases, but the water lingers at the surface of the substrate before evaporating. That lingering water catalyzes further $HF/SiO_2$ reaction.

An HF vapor clean process is generally carried out in a process chamber at a temperature between about 10° C. and about 100° C., such as about 25° C., and at a pressure between about 3 Torr and about 760 Torr (1 atmosphere). The HF vapor clean process leaves the clean silicon surface terminated with hydrogen, and avoids plasma damage that can result from use of RF plasmas. A chamber that performs a vapor cleaning of this sort may be integrated into a cluster of chambers attached to a transfer chamber, or may be a stand-alone chamber.

While the foregoing is directed to embodiments of the invention, other and further embodiments of the invention may be devised without departing from the basic scope thereof.

What is claimed is:

1. A method of processing a solar cell substrate having a native oxide layer, comprising:
   disposing the solar cell substrate in a processing chamber having walls;
   exposing the native oxide layer to a reactive fluorine containing gas mixture while maintaining a temperature of the substrate below a temperature of the walls;
   removing the native oxide layer; and
   depositing hydrogen, fluorine, or both on the substrate surface.

2. The method of claim 1, wherein the reactive fluorine containing gas mixture is an etchant gas mixture.

3. The method of claim 1, wherein the reactive fluorine containing gas mixture comprises hydrogen, and the temperature of the substrate is maintained at a temperature of about 15° C. to about 50° C.

4. The method of claim 3, wherein the reactive fluorine containing gas mixture further comprises nitrogen.

5. The method of claim 3, wherein the reactive fluorine containing gas mixture comprises HF.

6. The method of claim 1, wherein the reactive fluorine containing gas mixture comprises active species.

7. The method of claim 6, wherein the active species comprise radicals.

8. The method of claim 7, wherein the reactive fluorine containing gas mixture further comprises a carrier gas.

9. The method of claim 1, wherein the reactive fluorine containing gas mixture is activated prior to exposing the native oxide layer to the reactive fluorine containing gas mixture, and removing the native oxide layer comprises forming a thin film from the native oxide layer and the reactive fluorine containing gas mixture.

10. The method of claim 9, wherein removing the native oxide layer further comprises heating the thin film.

11. The method of claim 1, wherein the reactive fluorine containing gas comprises nitrogen trifluoride ($NF_3$).

12. The method of claim 11, further comprising exposing the native oxide layer to ammonia ($NH_3$) while maintaining a temperature of the substrate below a temperature of the walls.

13. A method of forming a photovoltaic device, comprising:
   forming a first silicon containing layer on a substrate;
   performing a dry cleaning process that removes impurities from a surface of the first silicon containing layer and deposits fluorine or hydrogen or both on the first silicon containing layer;
      wherein the dry cleaning process comprises exposing the surface of the first silicon containing layer to a reactive fluorine containing gas mixture, the reactive fluorine containing gas mixture comprises active species, the active species form a thin film on the first silicon containing layer that is removed by an anneal process, and the active species etch the first silicon containing layer while forming the thin film; and then
   forming a second silicon containing layer on the first silicon containing layer.

14. The method of claim 13, wherein the dry cleaning process comprises a deposition process, an etching process, and an anneal process.

15. The method of claim 13, wherein the first silicon containing layer is doped with a p-type or an n-type dopant.

16. The method of claim 15, wherein the second silicon containing layer is doped with a p-type or an n-type dopant of opposite type from the first silicon containing layer.

17. The method of claim 13, wherein the reactive fluorine containing gas comprises nitrogen trifluoride ($NF_3$).

18. The method of claim 17, further comprising exposing the surface of the first silicon containing layer to ammonia ($NH_3$).

* * * * *